United States Patent
Schmitt et al.

(10) Patent No.: US 12,135,226 B2
(45) Date of Patent: Nov. 5, 2024

(54) MAGNETORESISTIVE ELEMENT WITH FREE-LAYER AND METHOD OF MANUFACTURING SAME

(71) Applicant: Analog Devices International Unlimited Company, County Limerick (IE)

(72) Inventors: Jochen Schmitt, Biedenkopf (DE); Cian Padraic O Dalaigh, Raheen (IE); Md Tarequzzaman, Limerick (IE); Onur Necdet Urs, Limerick (IE); Jan Kubik, Limerick (IE); Enno Lage, Kiel (DE)

(73) Assignee: Analog Devices International Unlimited Company, Limerick (IE)

( * ) Notice: Subject to any disclaimer, the term of this patent is extended or adjusted under 35 U.S.C. 154(b) by 137 days.

(21) Appl. No.: 17/317,675

(22) Filed: May 11, 2021

(65) Prior Publication Data
US 2021/0372820 A1    Dec. 2, 2021

Related U.S. Application Data

(60) Provisional application No. 63/030,092, filed on May 26, 2020.

(51) Int. Cl.
| | |
|---|---|
| *G01D 5/16* | (2006.01) |
| *H01F 10/32* | (2006.01) |
| *B62D 15/02* | (2006.01) |

(52) U.S. Cl.
CPC ............ *G01D 5/16* (2013.01); *H01F 10/3272* (2013.01); *B62D 15/021* (2013.01)

(58) Field of Classification Search
CPC ............. H01F 10/3272; H01F 10/3295; H01F 41/306; G01R 33/09; G01R 33/093; G01D 5/12; G01D 5/14; G01D 5/16
See application file for complete search history.

(56) References Cited

U.S. PATENT DOCUMENTS

| | | |
|---|---|---|
| 6,159,593 A | 12/2000 | Iwasaki et al. |
| 6,400,535 B1 | 6/2002 | Shimazawa et al. |

(Continued)

FOREIGN PATENT DOCUMENTS

| | | |
|---|---|---|
| WO | WO 2011/064822 A1 | 4/2013 |

OTHER PUBLICATIONS

Combined Search and Examination Report in GB2107355.6, dated Mar. 28, 2022.

(Continued)

*Primary Examiner* — Huy Q Phan
*Assistant Examiner* — David B Frederiksen
(74) *Attorney, Agent, or Firm* — Knobbe, Martens, Olson & Bear, LLP (57) ABSTRACT

A giant magnetoresistance (GMR) element is provided for use in a magnetic multi-turn sensor in which the free layer, that is, the layer that changes its magnetization direction in response to an external magnetic field so as to provide a resistance change, is thick enough to provide good shape anisotropy without exhibiting an AMR effect. To achieve this, at least a portion of the free layer comprises a plurality of layers of at least two different materials, specifically, a plurality of layers of at least a first material that is ferromagnetic and a plurality of layers of at least a second material that is known not to exhibit an AMR effect and that does not interfere with the GMR effect of the layers of ferromagnetic material.

22 Claims, 7 Drawing Sheets

(56) References Cited

U.S. PATENT DOCUMENTS

| | | | |
|---|---|---|---|
| 6,466,417 B1 | 10/2002 | Gill | |
| 6,819,532 B2 | 11/2004 | Kamijo | |
| 6,831,312 B2 | 12/2004 | Slaughter et al. | |
| 7,161,774 B2 | 1/2007 | Hayashi | |
| 7,163,755 B2 | 1/2007 | Hiramoto et al. | |
| 7,333,306 B2 | 2/2008 | Zhao et al. | |
| 8,058,697 B2 | 11/2011 | Guo et al. | |
| 8,091,209 B1* | 1/2012 | Gao | B82Y 10/00 360/122 |
| 8,194,365 B1* | 6/2012 | Leng | H10N 50/85 360/324.12 |
| 8,498,084 B1 | 7/2013 | Leng et al. | |
| 8,647,891 B2 | 2/2014 | Sun et al. | |
| 9,214,170 B2 | 12/2015 | Wang et al. | |
| 2003/0179510 A1* | 9/2003 | Hayakawa | G11B 5/3903 365/158 |
| 2004/0057166 A1* | 3/2004 | Gill | G11B 5/313 |
| 2004/0257719 A1* | 12/2004 | Ohba | H10B 61/22 427/127 |
| 2005/0195534 A1* | 9/2005 | Gill | G01R 33/098 360/324.12 |
| 2005/0205908 A1* | 9/2005 | Fukuzumi | H10B 61/22 257/E27.005 |
| 2007/0058300 A1* | 3/2007 | Xue | G01R 33/093 360/313 |
| 2007/0139827 A1* | 6/2007 | Gao | G11B 5/3909 360/324.2 |
| 2008/0113220 A1* | 5/2008 | Sun | H10N 50/10 428/800 |
| 2009/0121710 A1 | 5/2009 | Wang et al. | |
| 2009/0174968 A1* | 7/2009 | Singleton | G11B 5/398 360/319 |
| 2010/0028530 A1 | 2/2010 | Parkin | |
| 2010/0255349 A1 | 10/2010 | Gao | |
| 2011/0164448 A1 | 7/2011 | Sato et al. | |
| 2011/0188157 A1* | 8/2011 | Zhao | H10N 50/01 216/22 |
| 2012/0229936 A1 | 9/2012 | Fuji et al. | |
| 2015/0185297 A1* | 7/2015 | Zimmer | G01R 33/095 324/252 |
| 2015/0249210 A1 | 9/2015 | Zhao et al. | |
| 2017/0018703 A1 | 1/2017 | Freitag et al. | |
| 2017/0244377 A1* | 8/2017 | Yamane | H10N 50/85 |
| 2017/0261345 A1 | 9/2017 | Schmitt | |
| 2017/0345449 A1* | 11/2017 | Shibata | H10N 50/00 |
| 2019/0165253 A1 | 5/2019 | Sun et al. | |

OTHER PUBLICATIONS

Japanese Office Action for Japanese Patent Application No. 2021-087703, issued Feb. 28, 2024. (7 pages).

* cited by examiner

MAGNETORESISTIVE ELEMENT WITH FREE-LAYER AND METHOD OF MANUFACTURING SAME

INCORPORATION BY REFERENCE TO ANY PRIORITY APPLICATIONS

This application claims the benefit of priority of U.S. Provisional Application No. 63/030092 filed May 26, 2020, the content of which is hereby incorporated by reference herein in its entirety. Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The present disclosure relates to magnetic sensors. In particular, the present disclosure relates to giant magnetoresistance element for use in a magnetic multi-turn sensor.

Magnetic multi-turn sensors are commonly used in applications where there is a need to monitor the number of times a device has been turned. An example is a steering wheel in a vehicle. Magnetic multi-turn sensors typically include giant magnetoresistance (GMR) elements that are sensitive to an applied external magnetic field. The resistance of the GMR elements can be changed by rotating a magnetic field within the vicinity of the sensor. Variations in the resistance of the GMR elements can be tracked to determine the number of turns in the magnetic field, which can be translated to a number of turns in the device being monitored.

Figure 1:
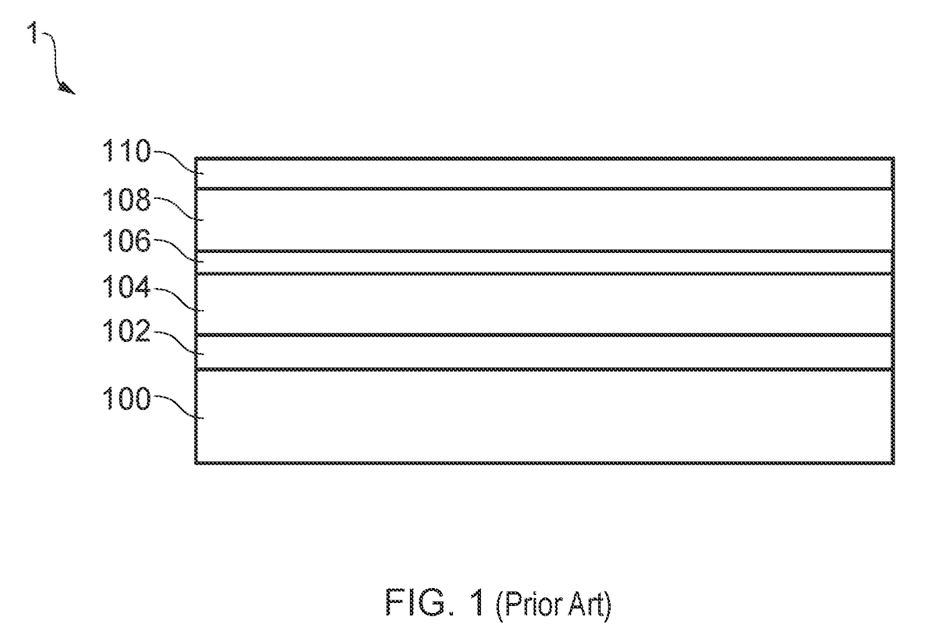
FIG. 1 is a schematic side view of a GMR stack according to the prior art.

The GMR elements are often based on a GMR spin valve stack using an artificial antiferromagnetic (AAF) material, such as the stack 1 shown in FIG. 1. The stack 1 comprises a substrate 100 at the base, followed by a seed layer 102 for promoting growth of the following layers by providing a smooth surface and a favourable crystal structure on which to grow. The next layer is an AAF multi-layer 104 comprising a sequence of layers that comprise a natural antiferromagnetic layer (such as platinum manganese (PtMn) or iridium manganese (IrMn)), a ferromagnetic layer (typically cobalt iron (CoFe)), a non-magnetic spacer (ruthenium (Ru)) and another ferromagnetic layer (CoFe), which is also referred to as the "pinned" layer. The main purpose of the AAF layer 104 is to keep the magnetization of the pinned layer aligned in an orientation defined in the annealing process during manufacture.

A non-magnetic spacer layer 106 (typically copper (Cu)) is provided directly on top of the pinned layer of the AAF layer 104, followed by the so-called free layer 108. The free layer 108 is a ferromagnetic layer free to align its magnetization with an external magnetic field. The free layer 108 is typically formed of 2 ferromagnetic layers, typically a CoFe layer followed by a nickel iron (NiFe) layer. The GMR effect is observed as a change of film resistance associated with the relative angle between the magnetization of the free layer 108 and the magnetization of the pinned layer in the AAF layer 104. When the magnetizations are parallel, a low resistance is observed, and when anti-parallel, a high resistance is observed. The purpose of the non-magnetic layer 106 is thus to create a distance between the free layer 108 and the pinned layer, and the thickness of this spacer layer 106 will be chosen so that the magnetic coupling between the pinned layer and the free layer 108 is minimized The stack 1 is then usually topped with a capping layer 110, typically a non-magnetic metal layer, which protects the stack 1 and reduces diffusions when connecting the stack 1 to other metal layers (such as aluminium, copper or gold) in order to provide interconnects for connecting the stack 1 to other components of the magnetic sensor.

SUMMARY

The present disclosure provides a giant magnetoresistance (GMR) element for use in a magnetic multi-turn sensor in which the free layer, that is, the layer that changes its magnetization direction in response to an external magnetic field so as to provide a resistance change, is thick enough to provide good shape anisotropy without exhibiting an AMR effect. To achieve this, at least a portion of the free layer comprises a plurality of layers of at least two different conductive materials, specifically, a plurality of layers of at least a first material that is ferromagnetic and a plurality of layers of at least a second material that is known not to exhibit an AMR effect and that does not interfere with the GMR effect of the layers of ferromagnetic material.

A first aspect of the present disclosure provides a giant magnetoresistive (GMR) element for a magnetic multi-turn sensor according to a first aspect, the giant magnetoresistive element comprising a reference layer, a non-magnetic layer adjacent to the reference layer, and a free-layer of ferromagnetic material, wherein the free layer comprises a first layer of ferromagnetic material adjacent to the non-magnetic layer, and a multi-layer arrangement at least comprising a plurality of layers of a first material, the first material being ferromagnetic, and a plurality of layers of a second material.

Preferably, the second material is a material having negligible or near-negligible anisotropic magnetoresistive (AMR) effect. The plurality of layers of the first material and the plurality of layers of the second material may then be arranged in an alternating configuration.

As such, by having layers of two different materials, where one of those materials is ferromagnetic and the other material exhibits negligible or very close to negligible AMR effect, a free layer that is thick enough to provide good shape anisotropy whilst exhibiting no AMR effect, or very little AMR effect relative to the amount of GMR effect exhibited. In this respect, the layers of the material that exhibits negligible AMR effect will attenuate any AMR effect that may be present in the layers of the ferromagnetic material.

In some arrangements, the first material may be one of NiFe and CoFe. The second material may be one of CoFeB, CoZrTa, CoZrTaB, CoZrNb, and CoZrO.

In some arrangements, a thickness and/or composition of the first material and second material may be configured such that the free-layer is magnetostriction-free. That is to say, there will be no mechanical strain or deformation in the free-layer as the magnetization changes.

Each of the plurality of layers of the first material and the plurality of layers of the second material may have a thickness of about 0.5 nm up to about 8 nm. It will also be appreciated that any suitable number of layers may be used, depending on the thickness of the free-layer and the thickness of the individual layers.

It will be understood that the "free-layer is so-called in that at least the first layer of ferromagnetic material has a magnetization that is free to align with an externally applied magnetic field. The first layer of ferromagnetic material may be CoFe, or any other suitable ferromagnetic material with strong GMR properties.

It will also be understood that the reference layer is so-called in that at least a portion of the reference layer has a magnetization that is in a fixed direction. The portion of the reference layer having a fixed magnetization direction may also be referred to as the "pinned" layer, said pinned layer being a layer of ferromagnetic material. The GMR effect is observed as a change of film resistance associated with the relative angle between the magnetization of the free layer and the magnetization of the pinned layer. The reference layer may comprise a sequence of layers defining an artificial antiferromagnetic material, wherein a layer of the artificial antiferromagnetic material has a magnetization in a fixed direction. The artificial antiferromagnetic material may comprise a natural antiferromagnetic layer, a first ferromagnetic layer, a non-magnetic spacer and a second ferromagnetic layer, wherein the second ferromagnetic layer is the pinned layer.

In other arrangements disclosed herein, the second material may be a non-magnetic material. As before, the ferromagnetic material may be one of NiFe and CoFe, whilst the non-magnetic material may be one of Ta, Ru and Cu.

In such cases, each of the plurality of layers of the ferromagnetic material and the plurality of layers of the non-magnetic material may have a thickness of about 0.2 nm up to about 0.4 nm.

Other arrangements described herein provide a magnetoresistive element for a magnetic multi-turn sensor, wherein the magnetoresistive element comprises a reference layer of antiferromagnetic material, a non-magnetic layer adjacent to the reference layer, and a free-layer of ferromagnetic material, wherein the free layer comprises a first layer of ferromagnetic material adjacent to the non-magnetic layer, and a second layer of amorphous ferromagnetic material.

The amorphous ferromagnetic material may be one of: CoFeB, CoZrTa, CoZrTaB, CoZrNb, and CoZrO, whilst the first layer may comprise a crystalline ferromagnetic material. For example, the first layer of ferromagnetic material may be CoFe.

A further aspect of the present disclosure provides a magnetic multi-turn sensor comprising one or more giant magnetoresistive elements, each giant magnetoresistive element comprising a reference layer, a non-magnetic layer adjacent to the reference layer, and a free-layer of ferromagnetic material, wherein the free layer comprises a first layer of ferromagnetic material adjacent to the non-magnetic layer, and a multi-layer arrangement at least comprising a plurality of layers of a first material, the first material being ferromagnetic, and a plurality of layers of a second material.

As described above, the second material is preferably a material having negligible or near-negligible anisotropic magnetoresistive (AMR) effect. In some arrangements, the first material may be one of NiFe and CoFe. The second material may be one of CoFeB, CoZrTa, CoZrTaB, CoZrNb, and CoZrO.

Yet a further aspect provides a method of manufacturing a giant magnetoresistive element, wherein the method comprises forming a reference layer, forming a non-magnetic layer adjacent to the reference layer, and forming a free-layer of ferromagnetic material, wherein the free layer comprises a first layer of ferromagnetic material adjacent to the non-magnetic layer, and a multi-layer arrangement at least comprising a plurality of layers of a first ferromagnetic material, the first material being ferromagnetic, and a plurality of layers of a second material.

The method may comprise forming a plurality of layers of the first material and a plurality of layers of the second material in an alternating sequence to provide the multi-layer arrangement of the free layer.

For example, the method may comprise forming a first layer of the first material, forming a first layer of the second material on the first layer of the first material, forming a second layer of the first material on the first layer of the second material, and forming a second layer of the second material on the second layer of the first material. It will of course be appreciated that this process may be continued for many layers.

Again, the second material is preferably a material having negligible or near-negligible anisotropic magnetoresistive (AMR) effect, such that, when alternated with the layers of ferromagnetic material, any AMR effect present in the layers of ferromagnetic material is attenuated.

Forming the reference layer may comprise forming a plurality of layers to provide an artificial antiferromagnetic material. The artificial antiferromagnetic material may comprise a natural antiferromagnetic layer, a first ferromagnetic layer, a non-magnetic spacer and a second ferromagnetic layer, wherein the second ferromagnetic layer is the layer having a magnetization in a fixed direction.

The method may further comprise providing a substrate, and forming the antiferromagnetic material or the free layer on the substrate. In doing so, a GMR stack is formed with the reference layer being arranged at the bottom or the top of the stack.

It will also be appreciated that the stack may comprise other layers, such as a seed layer formed on the substrate for promoting growth of the following layers, and a capping layer for protecting the stack and providing interconnects to other components of the magnetic multi-turn sensor.

Any of the layers described above may be formed using some suitable fabrication process such as sputtering or ion beam deposition.

BRIEF DESCRIPTION OF THE DRAWINGS

The present disclosure will now be described by way of example only with reference to the accompanying drawings in which.

DETAILED DESCRIPTION

Magnetic multi-turn sensors can be used to monitor the turn count of a rotating shaft. To do this, a magnet is typically mounted to the end of the rotating shaft, the multi-turn sensor being sensitive to the rotation of the magnetic field as the magnet rotates with the shaft. Such magnetic sensing can be applied to a variety of different applications, such as automotive applications, medical applications, industrial control applications, consumer applications, and a host of other applications which use information regarding a position of a rotating component.

Magnetic multi-turn sensors typically include giant magnetoresistance (GMR) elements that are sensitive to an applied external magnetic field. The GMR elements are often based on a GMR spin valve stack comprising a free layer of ferromagnetic material that is free to align its magnetization with the external magnetic field. In a typical GMR stack, the thickness of the free layer is usually less than 5 nm. However, in order to create a strong shape anisotropy in long and narrow traces of the film, the free layer has to be very thick (>30 nm). As a result of this thickness, a strong anisotropy magnetoresistance (AMR) effect exhibited in the free layer, whereby the electrical resistance is further dependent on the angle between the direction of electric current and the direction of magnetization. Generally, when the current is parallel to the magnetization, a higher resistance is observed, and when the current is perpendicular to the magnetization, a lower resistance is observed. Consequently, this creates an unwanted resistance change that is super imposed to the desired resistance change due to the GMR effect and thereby distorts the sensor output.

The present disclosure therefore provides a giant magnetoresistance (GMR) element for use in a magnetic multi-turn sensor in which the free layer, that is, the layer that changes its magnetization direction in response to an external magnetic field so as to provide a resistance change, is thick enough to provide good shape anisotropy whilst exhibiting no AMR effect, or very little AMR effect relative to the amount of GMR effect exhibited (less than 10%). To achieve this, at least a portion of the free layer comprises a plurality of layers of at least two different materials, specifically, a plurality of layers of at least a first material that is ferromagnetic and a plurality of layers of at least a second material that is known not to exhibit an AMR effect and that does not interfere with the GMR effect of the layers of ferromagnetic material.

Figure 2:
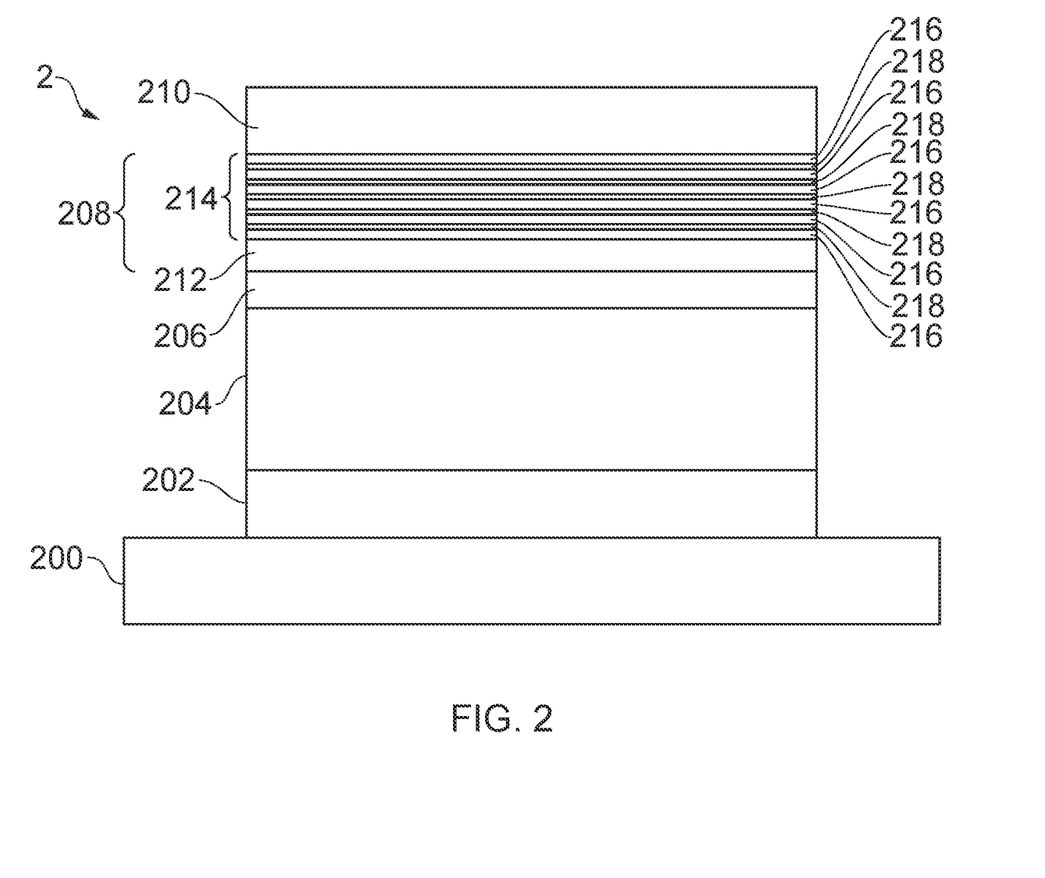
FIG. 2 is a schematic side view of a GMR stack in accordance with an embodiment of the disclosure.

One embodiment according to the present disclosure is shown in FIG. 2. As described with reference to FIG. 1, the GMR elements is configured as a spin valve stack 2 that comprises a substrate 200, a seed layer 202, an AAF layer 204, and a non-magnetic spacer layer 206. The free layer, shown at 208, comprises a first ferromagnetic layer 212, preferably a crystalline ferromagnetic material with low AMR effect such as CoFe, followed by a multi-layered arrangement 214. As discussed above, the GMR effect is observed at the interfaces of the pinned layer of the AAF layer 204, the non-magnetic spacer layer 206 and the first ferromagnetic layer 212. The multi-layered arrangement 214 comprises multiple layers of both crystalline ferromagnetic material 216 and amorphous ferromagnetic material 218 arranged in alternating layers. The crystalline ferromagnetic layers 216 are formed of a crystalline ferromagnetic material such as NiFe, whilst the amorphous ferromagnetic layers 218 maybe formed by any suitable amorphous ferromagnetic materials such as cobalt iron boron (CoFeB), cobalt zirconium tantalum (CoZrTa), cobalt zirconium tantalum boron (CoZrTaB), cobalt zirconium niobium (CoZrNb), or cobalt zirconium oxide (CoZrO). The magnetization of the layers of amorphous ferromagnetic 218 will also align with an externally applied magnetic field and thus the multi-layer arrangement 214 will behave as one ferromagnetic layer aligning with the external magnetic field, and thus providing good shape anisotropy. However, in amorphous ferromagnetic materials, there is no or very little AMR effect observed since there is little effect on the current flow as a result of the change in magnetization direction, and the layers of crystalline ferromagnetic material 216 will be individually too thin to exhibit any AMR effect, or at least will exhibit a negligible or very small amount. Therefore, by interspersing the layers of crystalline ferromagnetic material 216 with layers of amorphous ferromagnetic material 218, a ferromagnetic multi-layer arrangement 214 is provided that is thick enough to provide the desired shape anisotropy without then inducing any unwanted AMR effect. Indeed, it will be appreciated by the skilled person that the ferromagnetic multi-layer arrangement 214 may be comprise layers of any two ferromagnetic materials, wherein at least one of those ferromagnetic materials exhibits a negligible or near-negligible amount of AMR effect to thereby attenuate any AMR effect exhibited by the other ferromagnetic material.

The individual layers 216, 218 of the multi-layer arrangement 214 may be between around 0.5 nm up to about 8 nm, with the total thickness of the free layer 208 being approximately 10 nm to 50 nm.

When choosing the thickness of the layers 216, 218, as well as the composition, the resulting magnetostriction experienced by the multi-layer arrangement 214 may also need to be considered. Magnetostriction is the relationship between the mechanical stressing of a material and magnetization. This relationship works in both directions in that a change of magnetization results in mechanical strain or deformation, and mechanical deformation results in a magnetization change. A measurement of magnetostriction can have positive or negative in sign, depending on whether a material elongates or shortens when magnetized in a particular direction.

For sensor application, a very low or ideally zero magnetostriction is desirable. Some crystalline ferromagnetic materials such as NiFe have very low magnetostriction. For example, NiFe with a Ni:Fe ratio of 81:19 is magnetostriction-free. Therefore, such materials are typically preferred for providing the free layer in GMR sensors. On the other hand, other crystalline ferromagnetic materials such as CoFe and amorphous ferromagnetic materials such as CoFeB have significant magnetostriction. Therefore, for a multi-layer arrangement 214 comprising amorphous ferromagnetic material 218 that has positive magnetostriction, the thickness and composition of the layer of crystalline ferromagnetic material 216 may need to be adapted so that it has negative magnetostriction to compensate for the positive magnetostriction of the other layers, thereby resulting in a free layer 208 that is overall magnetostriction-free.

The stack 2 is then usually topped with a capping layer 210, typically a non-magnetic metal layer such as tantalum (Ta) or titanium tungsten (TiW), which protects the stack 2 and reduces diffusions when connecting the stack 2 to other metal layers (such as aluminium, copper or gold) in order to provide interconnects for connecting the stack 2 to other components of the magnetic sensor.

Figure 3:
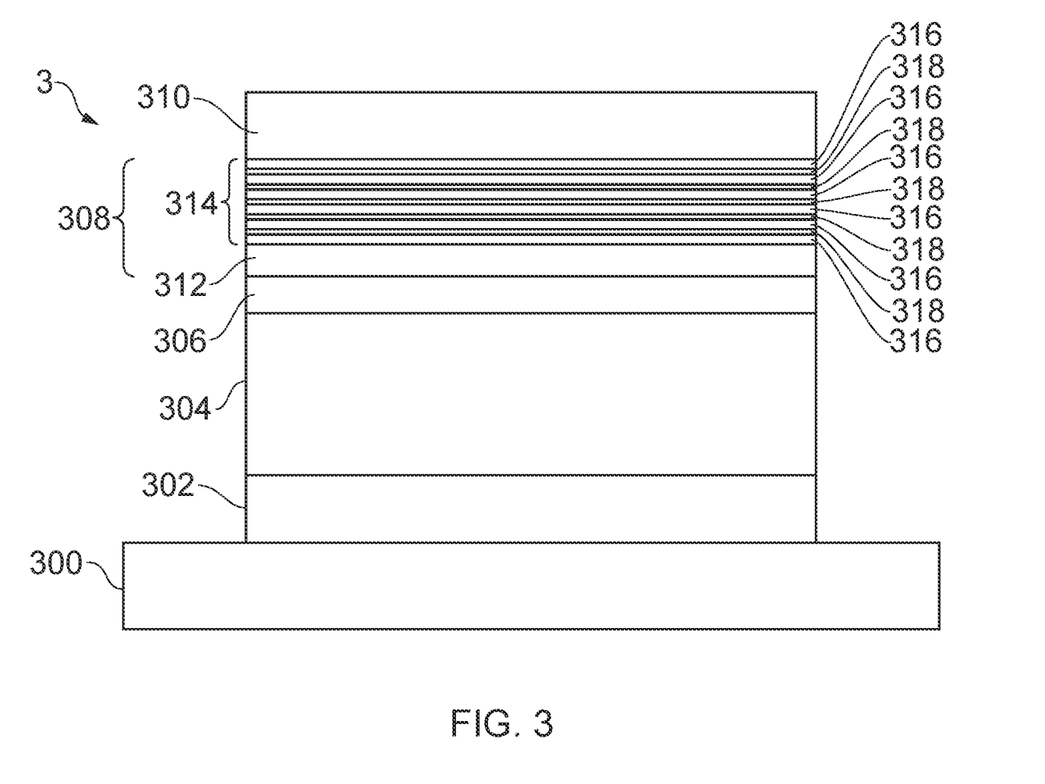
FIG. 3 is a schematic side view of a GMR stack in accordance with a further embodiment of the disclosure.

A further embodiment according to the present disclosure is also shown at FIG. 3. As a before, the GMR elements is configured as a spin valve stack 3 comprising a substrate 300, a seed layer 302, an AAF layer 304, and a non-magnetic spacer layer 306. The free layer, shown generally at 308, comprises a first ferromagnetic layer 312, preferably a crystalline ferromagnetic material with low AMR effect such as CoFe, followed by another multi-layer arrangement 314. In this embodiment, the multi-layer arrangement 314 is formed of a plurality of ferromagnetic layers 316, formed of a soft magnetic material such as NiFe, and a plurality of non-magnetic layers 318, again arranged as alternating layers. The non-magnetic material layers 318 may be any suitable material, for example, Ta, Ru or Cu. The non-magnetic layers 318 do not add any magnetic moments to the free layer 308, and therefore do not exhibit any AMR effect, whilst the layers of ferromagnetic 316 will be individually too thin to exhibit any AMR effect, or at least will exhibit a negligible or very small amount. Therefore, by interspersing the layers of ferromagnetic material 316 with layers of non-magnetic material 318, a ferromagnetic multi-layer arrangement 314 is provided that is thick enough to provide the desired shape anisotropy without then inducing any unwanted AMR effect.

In such an arrangement, is important that the ferromagnetic layers 316 are thin enough that they do not produce any AMR effect, and that the non-magnetic layers 318 are thin enough to ensure strong ferromagnetic coupling between the ferromagnetic layers, that is, so that the shape anisotropy exhibited by the multi-layer arrangement 314 corresponds to the sum of the ferromagnetic layers 316 as opposed to each individual ferromagnetic layer 316. For example, the thickness of both sets of layers 316, 318 may be about 0.2 nm up to about 0.4 nm.

Furthermore, as discussed above, the ferromagnetic layers 316 may be formed of a soft magnetic material that has very low or zero magnetostriction, such as NiFe. As these ferromagnetic layers 316 are interspersed with non-magnetic layers 318, the free layer 308 is overall a soft magnet that is not magnetostrictive.

The stack 3 is then usually topped with a capping layer 210, typically a non-magnetic metal layer, which protects the stack 3 and reduces diffusions when connecting the stack 3 to other metal layers (such as aluminium, copper or gold) in order to provide interconnects for connecting the stack 3 to other components of the magnetic sensor.

It will be appreciated that in either of the above embodiments, any number of layers (and thickness of layers) may be used in the multi-layer arrangements, 214, 314 depending on the thickness and shape anisotropy to be used. For example, there may be four layers in total, or as many as twenty layers in total.

Additionally, it will also be appreciated that in either of the above embodiments, a natural antiferromagnetic layer such as platinum manganese (PtMn) may be used in place of the AAF layer 204, 304, with which a measurable GMR effect will also be observed.

Figure 4:
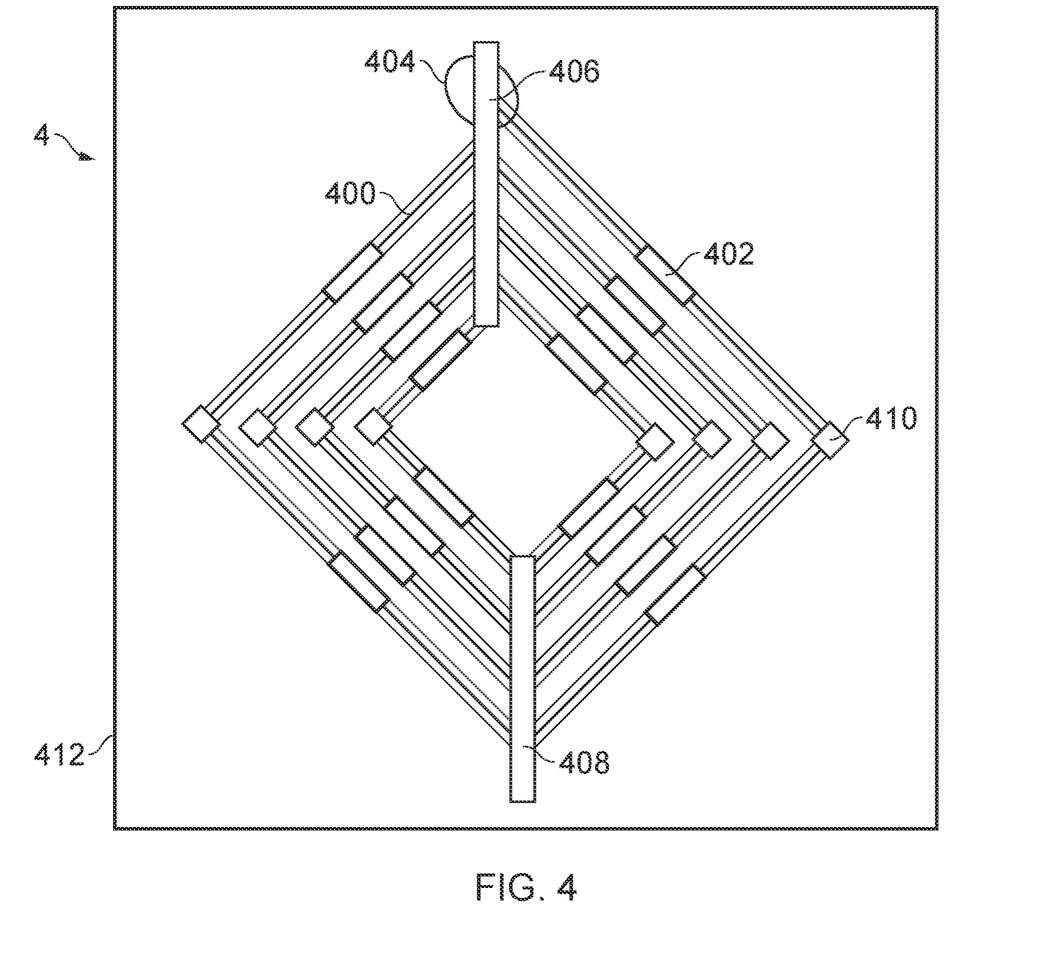
FIG. 4 is an example of a magnetic multi-turn system comprising GMR elements in accordance with embodiments of the disclosure.

FIG. 4 shows an example of a magnetic strip layout representation of a magnetic multi-turn sensor 4 comprising a plurality of GMR elements 400 in accordance with the embodiments of the present disclosure. In the example of FIG. 4, the magnetic strip 400 is a giant magnetoresistance track that is physically laid out in a spiral configuration. As such, the magnetic strip 400 has a plurality of segments formed of the magnetoresistive elements 402 arranged in series with each other. The magnetoresistive elements 402 act as variable resistors that change resistance in response to a magnetic alignment state. One end of the magnetic strip 400 is coupled to a domain wall generator (DWG) 404. In this respect, it will be appreciated that the DWG 404 may be coupled to either end of the magnetic strip 400. The DWG 404 generates domain walls in response to rotations in an external magnetic field, or the application of some other strong external magnetic field beyond the operating magnetic window of the sensor 4. These domain walls can then be injected into the magnetic strip 400. As the magnetic domain position changes, the resistance of the GMR elements 402 will also change due to the resulting change in magnetic alignment.

In order to measure the varying resistance of the GMR elements 402 as domain walls are generated, the magnetic strip 400 is electrically connected to a supply voltage VDD 406 and to ground GND 408 to apply a voltage between a pair of opposite corners. The corners half way between the voltage supplies are provided with electrical connections 410 so as to provide half-bridge outputs. As such, the multi-turn sensor 4 comprises multiple Wheatstone bridge circuits, with each half-bridge 410 corresponding to one half-turn or 180° rotation of an external magnetic field. Measurements of voltage at the electrical connections 410 can thus be used to measure changes in the resistance of the GMR elements 402, which is indicative of changes in the magnetic alignment of the free layer.

The example shown by FIG. 4 comprises four spiral windings eight half-bridges 410, and is thus configured to count four turns of an external magnetic field. However, it will be appreciated that a multi-turn sensor may have any number of spiral windings depending on the number of GMR elements. In general, multi-turn sensors can count as many turns as spiral windings. It will also be appreciated that the GMR elements 402 may be electrically connected in any suitable way so as to provide sensor outputs representative of the changes in magnetic alignment state. For example, the GMR elements 402 may be connected in a matrix arrangement such as that described in US 2017/0261345, which is hereby incorporated by reference in its entirety. As a further alternative, each magnetoresistive segment may be connected individually, rather than in a bridge arrangement.

In this example, the magnetic multi-turn sensor 4 also comprises an integrated circuit 412 on which the magnetic strip 400 is disposed, which may also comprise processing circuitry (not shown) for processing the sensor outputs. A method of fabricating the GMR stack 2 will now be described with reference to FIGS. 5A to 5I. However, it will be appreciated that the GMR stack 3 may be fabricated in a similar way.

Figure 5A:
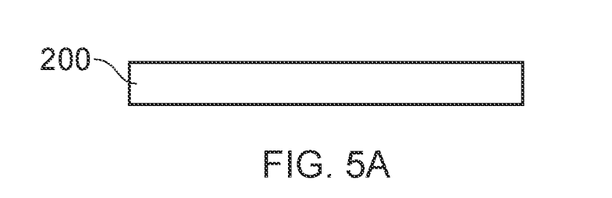
FIG. 5A-5I are schematic side views illustrating the method of manufacturing a GMR stack in accordance with embodiments of the present disclosure.

FIG. 5A shows the first step in the fabrication process. A silicon wafer is used as the substrate 200. In the following, the process for forming one device will be described, however several hundred devices may be formed in parallel on the same wafer. The substrate 200 is used for mechanical support, and could be substituted for another type of material, such as glass or sapphire. Typically, the silicon wafer is oxidized to isolate the following layers from the bare silicon, or an isolator such as aluminum oxide may be used. In some arrangements, the substrate 200 may also comprise electronic circuitry.

Figure 5B:
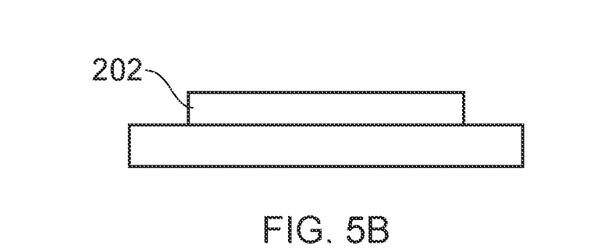

A seed layer 202 is then deposited on the substrate 200, as shown in FIG. 5B. The seed layer 202 provides a smooth surface and a favourable crystal structure for promoting growth of the following layers. The seed layer 202 may be a layer of tantalum, ruthenium or tantalum nitride (TaN), a may also include another layer of other compounds.

Figure 5C:
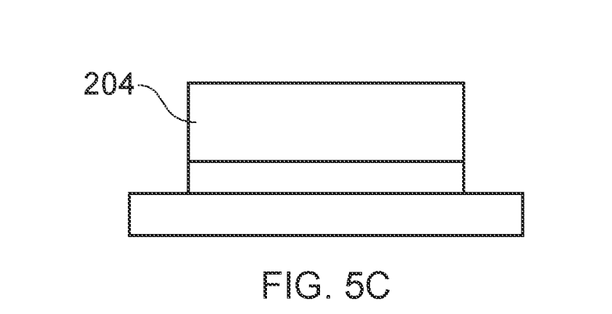

FIG. 5C shows formation of the AAF layer 204, which is deposited on the seed layer 202. The AAF layer 204 be formed by first depositing a natural antiferromagnetic layer onto the seed layer 202. A ferromagnetic layer is then deposited onto the antiferromagnetic layer, followed by a non-magnetic spacer layer. Finally, a second ferromagnetic layer is deposited onto the non-magnetic layer. This second ferromagnetic layer is the so-called "pinned" layer or "reference" layer. The antiferromagnetic material used in the AAF layer 204 may be PtMn, IrMn, NiMn or some other suitable antiferromagnetic material, the ferromagnetic material may be CoFe or some other suitable ferromagnetic material, whilst the non-magnetic material is typically ruthenium.

Figure 5D:
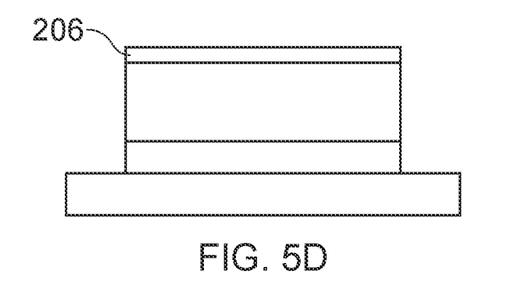

As shown in FIG. 5D, the non-magnetic spacer layer 206 is formed onto the pinner layer of the AAF layer 204. This acts as a spacer between the pinned layer and the following free layer to reduce any magnetic coupling.

Figure 5E:
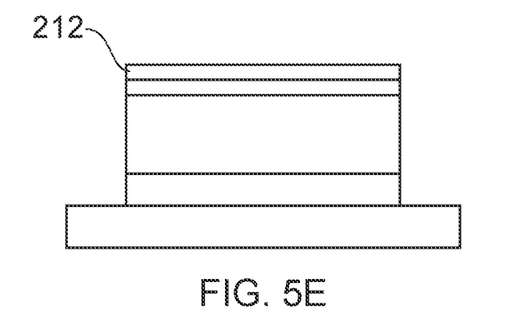

FIG. 5E shows the beginning of the free layer, which is formed by first depositing the first ferromagnetic layer 212.

Figure 5F:
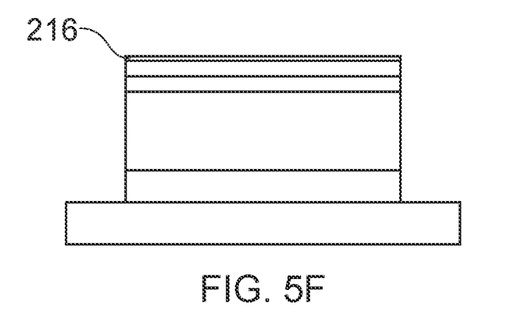
Figure 5G:
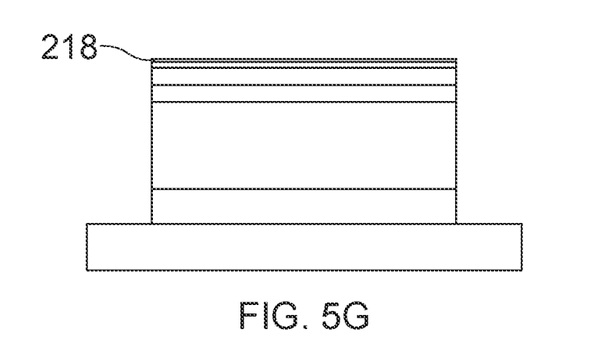
Figure 5H:
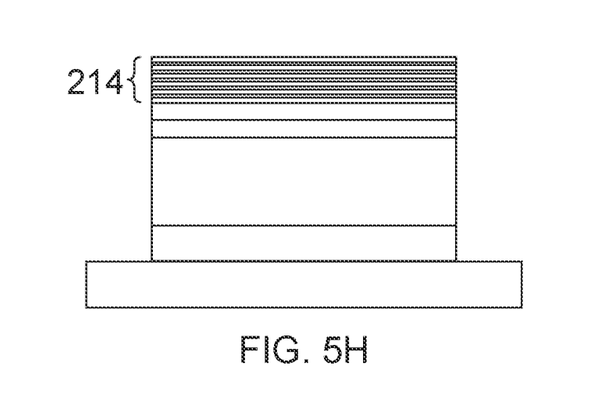
Figure 5I:
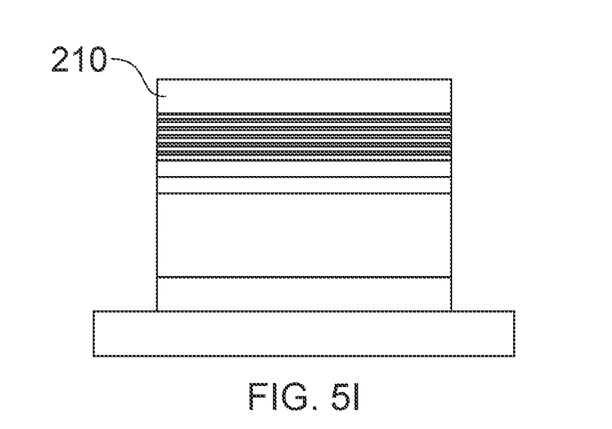

The multi-layer arrangement is then deposited onto first ferromagnetic layer, first by depositing a layer of crystalline ferromagnetic material 216, as shown in FIG. 5F, and then depositing a layer of amorphous ferromagnetic material 218, as shown in FIG. 5G. This process is repeated as many times until the entire multi-layer arrangement 214 is formed, as shown in FIG. 5H. Finally, the capping layer 210 is placed over the stack 2, as shown in FIG. 5I. As discussed above, the capping layer 210 is typically made of a non-magnetic metal layer, which protects the stack 2 and reduces diffusions when connecting the stack 2 to other metal layers to provide interconnects.

Once deposition has been performed, the GMR film may then be annealed in a magnetic field, and patterned using standard photolithography techniques and subsequent ion milling to remove excess material and form the resistor shape.

In the embodiment of FIG. 3, it will be appreciated that the stack 3 may be fabricated in substantially the same way, with ferromagnetic layers 316 and non-magnetic layers 318 of the multi-layer arrangement 314 being formed in substantially the same way as that shown in FIGS. 5F-5H.

It will be appreciated that each of the layers within the stacks 2, 3 described above may be formed using any suitable method of physical vapor deposition, such as sputtering. Similarly, the deposition of each stack 2, 3 may be performed in one vacuum step so that there is no exposure to ambient atmosphere between the individual steps, thereby avoiding contamination or oxidation of the various layers. For example, the whole stack 2, 3, starting from the seed layer 202, 302 up to the capping layer 210, 310 is deposited by either sputtering or ion beam deposition with one tool, without breaking the vacuum between the different layers to prevent surface contamination and changes due to exposure to atmospheric gases.

In a further embodiment of the disclosure, a GMR stack may be provided, wherein the free layer comprises a first layer of crystalline ferromagnetic material with low AMR effect, such as CoFe, and a second layer of an amorphous ferromagnetic material, such as CoFeB. Such an arrangement eliminates the use of any ferromagnetic material that exhibits a high AMR effect, but does in turn experience more magnetostriction.

Whilst the arrangements described above show the AAF layer 204, 304 at the bottom of the stack 2, 3 (so called "bottom pinned"), it will be appreciated that the stack 2, 3 may be alternatively arranged with the AAF layer 204, 304 at the top of the stack 2, 3 (so called "top pinned") with the non-magnetic spacer 206, 306 and then the free layer 208, 308 below.

Similarly, whilst the above arrangements describe the use of an AAF layer 204, it will be appreciated that a simple antiferromagnetic layer may be used instead, for example, comprising a layer of antiferromagnetic material such as PtMn, IrMn, NiMn, and one layer of ferromagnetic material, such as CoFe, acting as the "pinned" layer Applications Any of the principles and advantages discussed herein can be applied to other systems, not just to the systems described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Any of the principles and advantages discussed herein can be implemented in connection with any other systems, apparatus, or methods that benefit could from any of the teachings herein. For instance, any of the principles and advantages discussed herein can be implemented in connection with any devices with a need for correcting rotational angle position data derived from rotating magnetic fields. Additionally, the devices can include any magnetoresistance or Hall effect devices capable of sensing magnetic fields.

Aspects of this disclosure can be implemented in various electronic devices or systems. For instance, phase correction methods and sensors implemented in accordance with any of the principles and advantages discussed herein can be included in various electronic devices and/or in various applications. Examples of the electronic devices and applications can include, but are not limited to, servos, robotics, aircraft, submarines, toothbrushes, biomedical sensing devices, and parts of the consumer electronic products such as semiconductor die and/or packaged modules, electronic test equipment, etc. Further, the electronic devices can include unfinished products, including those for industrial, automotive, and/or medical applications.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). The words "based on" as used herein are generally intended to encompass being "based solely on" and being "based at least partly on." Additionally, the words "herein," "above," "below," and words of similar import, when used in this application, shall refer to this application as a whole and not to any particular portions of this application. Where the context permits, words in the Detailed Description of Certain Embodiments using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only, and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure.

What is claimed is:

1. A giant magnetoresistive element for a magnetic multi-turn sensor, the giant magnetoresistive element comprising:
    a reference layer;
    a non-magnetic layer adjacent to the reference layer; and
    a free-layer of ferromagnetic material, wherein the free-layer comprises a first layer of ferromagnetic material adjacent to the non-magnetic layer, and a multi-layer arrangement at least comprising a plurality of layers of a first material, the first material being ferromagnetic, and a plurality of layers of a second material,
    wherein a thickness of the free-layer is greater than 30 nm, and
    wherein the plurality of layers of the first material have a first magnetostriction and the plurality of layers of the second material have a second magnetostriction that reduces magnetostriction of the free-layer.

2. The giant magnetoresistive element according to claim 1, wherein the second material is a material having negligible or near-negligible anisotropic magnetoresistive (AMR) effect.

3. The giant magnetoresistive element according to claim 1, wherein the plurality of layers of the first material and the plurality of layers of the second material are arranged in an alternating configuration.

4. The giant magnetoresistive element according to claim 1, wherein the first material is one of: NiFe and CoFe.

5. The giant magnetoresistive element according to claim 1, wherein the second material is one of: CoFeB, CoZrTa, CoZrTaB, CoZrNb, and CoZrO.

6. The giant magnetoresistive element according to claim 1, wherein a thickness and/or composition of the first material and second material are configured such that the free-layer is magnetostriction-free.

7. The giant magnetoresistive element according to claim 1, wherein the each of the plurality of layers of the first material and the plurality of layers of the second material have a thickness of about 0.5 nm up to about 8 nm.

8. The giant magnetoresistive element according to claim 1, wherein the first layer of ferromagnetic material has a magnetization that is free to align with an externally applied magnetic field.

9. The giant magnetoresistive element according to claim 1, wherein the first layer of ferromagnetic material is CoFe.

10. The giant magnetoresistive element according to claim 1, wherein at least a portion of the reference layer has a magnetization that is in a fixed direction.

11. The giant magnetoresistive element according to claim 1, wherein the reference layer comprises a sequence of layers defining an artificial antiferromagnetic material, wherein a layer of the artificial antiferromagnetic material has a magnetization that is in a fixed direction.

12. The giant magnetoresistive element according to claim 1, wherein the second material is ferromagnetic, the second material being a different ferromagnetic material than the first material.

13. The giant magnetoresistive element according to claim 1, wherein the second material is a material having negligible or near-negligible anisotropic magnetoresistive (AMR) effect.

14. A magnetic multi-turn sensor comprising one or more giant magnetoresistive elements, each giant magnetoresistive element comprising:
    a reference layer;
    a non-magnetic layer adjacent to the reference layer; and
    a free-layer of ferromagnetic material, wherein the free-layer comprises a first layer of ferromagnetic material adjacent to the non-magnetic layer, and a multi-layer arrangement at least comprising a plurality of layers of a first material, the first material being ferromagnetic, and a plurality of layers of a second material,
    wherein a thickness of the free-layer is greater than 30 nm, and
    wherein the plurality of layers of the first material have a first magnetostriction and the plurality of layers of the second material have a second magnetostriction that reduces magnetostriction of the free-layer.

15. The magnetic multi-turn sensor according to claim 14, wherein the second material is a material having negligible or near-negligible anisotropic magnetoresistive (AMR) effect.

16. The magnetic multi-turn sensor according to claim 14, wherein the first material is one of: NiFe and CoFe.

17. The magnetic multi-turn sensor according to claim 14, wherein the second material is one of: CoFeB, CoZrTa, CoZrTaB, CoZrNb, and CoZrO.

18. A method of manufacturing a giant magnetoresistive element, wherein the method comprises:
    forming a reference layer;
    forming a non-magnetic layer adjacent to the reference layer; and
    forming a free-layer of ferromagnetic material, wherein the free-layer comprises a first layer of ferromagnetic material adjacent to the non-magnetic layer, and a multi-layer arrangement at least comprising a plurality of layers of a first ferromagnetic material, the first material being ferromagnetic, and a plurality of layers of a second material,
    wherein a thickness of the free-layer is greater than 30 nm, and
    wherein the plurality of layers of the first ferromagnetic material have a first magnetostriction and the plurality of layers of the second material have a second magnetostriction that reduces magnetostriction of the free-layer.

19. The method according to claim 18, wherein the method comprises forming a plurality of layers of the first material and a plurality of layers of the second material in an alternating sequence to provide the multi-layer arrangement of the free-layer.

20. The method according to claim 19, wherein the second material is a material having negligible or near-negligible anisotropic magnetoresistive (AMR) effect.

21. The method according to claim 18, wherein forming the reference layer comprises forming a plurality of layers to provide an artificial antiferromagnetic material.

22. The method according to claim 21, wherein the method further comprises:
    providing a substrate; and
    forming the artificial antiferromagnetic material or the free-layer on the substrate.

* * * * *